US011551975B2

(12) United States Patent
Sakamoto (10) Patent No.: US 11,551,975 B2
(45) Date of Patent: Jan. 10, 2023

(54) METHOD FOR MANUFACTURING ELECTRONIC DEVICE

(71) Applicant: SHARP KABUSHIKI KAISHA, Sakai (JP)

(72) Inventor: Mayuko Sakamoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 40 days.

(21) Appl. No.: 17/276,379

(22) PCT Filed: Sep. 28, 2018

(86) PCT No.: PCT/JP2018/036452
§ 371 (c)(1),
(2) Date: Mar. 15, 2021

(87) PCT Pub. No.: WO2020/065966
PCT Pub. Date: Apr. 2, 2020

(65) Prior Publication Data
US 2022/0037208 A1 Feb. 3, 2022

(51) Int. Cl.
*H01L 21/00* (2006.01)
*H01L 21/78* (2006.01)
*H01L 27/12* (2006.01)

(52) U.S. Cl.
CPC ...... *H01L 21/7806* (2013.01); *H01L 27/1266* (2013.01); *H01L 2227/323* (2013.01)

(58) Field of Classification Search
CPC ............. H01L 21/7806; H01L 27/1266; H01L 2227/323
See application file for complete search history.

(56) References Cited

U.S. PATENT DOCUMENTS

| 2005/0112805 | A1 | 5/2005 | Goto et al. |
| 2008/0009106 | A1 | 1/2008 | Goto et al. |
| 2010/0035407 | A1 | 2/2010 | Goto et al. |
| 2011/0204361 | A1 | 8/2011 | Nishiki et al. |
| 2019/0288092 | A1 | 9/2019 | Katayama et al. |

FOREIGN PATENT DOCUMENTS

| JP | 2004349543 | A | | 12/2004 | |
| JP | 2011197696 | A | | 10/2011 | |
| JP | 2018078292 | A | * | 5/2018 | ....... H01L 21/02172 |
| JP | 2018078292 | A | | 5/2018 | |
| JP | 2018144052 | A | | 9/2018 | |
| WO | 2009/037797 | A1 | | 3/2009 | |

* cited by examiner

*Primary Examiner* — Samuel A Gebremariam
(74) *Attorney, Agent, or Firm* — ScienBiziP, P.C.

(57) ABSTRACT

A method for manufacturing an electronic device includes the following: forming an island-shaped peeling layer onto a substrate; stacking a resin layer all over the peeling layer; forming a barrier layer over the resin layer; forming an electronic-circuit layer onto the upper surface of the barrier layer; and peeling off the resin layer from the substrate and the peeling layer.

13 Claims, 11 Drawing Sheets

METHOD FOR MANUFACTURING ELECTRONIC DEVICE

TECHNICAL FIELD

The disclosure relates to a method for manufacturing an electronic device.

BACKGROUND ART

Manufacturing a flexible electronic device includes, for instance, forming a stack of layers, such as a resin layer, a TFT layer, and a light-emitting element layer, onto a glass substrate, followed by laser application to the lower surface of the resin layer from the backside of the glass substrate to peel off the glass substrate.

CITATION LIST

Patent Literature

Patent Literature Japanese Patent Application Laid-Open No. 2004-349543 (published on Dec. 9, 2004)

SUMMARY

Technical Problem

Such a known method, delamination with a laser to peel off a glass substrate from a resin layer, unfortunately involves some problems (e.g., attachment of a carbide generated from a carbonized resin layer) resulting from laser heat.

Solution to Problem

Included are the following steps: first film-formation including forming a peeling layer having an island shape onto a motherboard; second film-formation including stacking a resin layer over at least a part of the peeling layer; third film-formation including forming a barrier layer over the resin layer; fourth film-formation including forming an electronic-circuit layer onto the upper surface of the barrier layer; and peeling off the resin layer from the motherboard and the peeling layer by irradiating the peeling layer and the resin layer with light.

Advantageous Effect of Disclosure

Such a configuration provides a method for manufacturing an electronic device that can avoid a problem in the above delamination and improve yield.

DESCRIPTION OF EMBODIMENTS

First Embodiment

Figure 2:
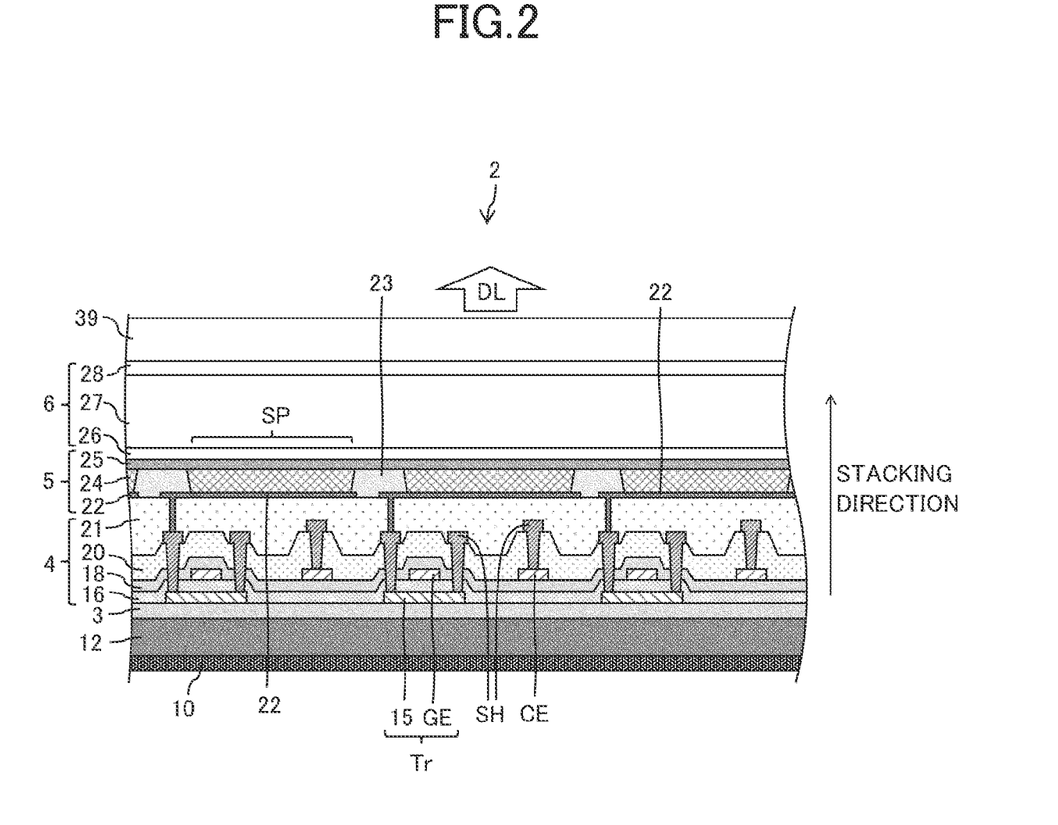
FIG. 2 is a sectional view of a configuration of the OLEO panel.
Figure 3:
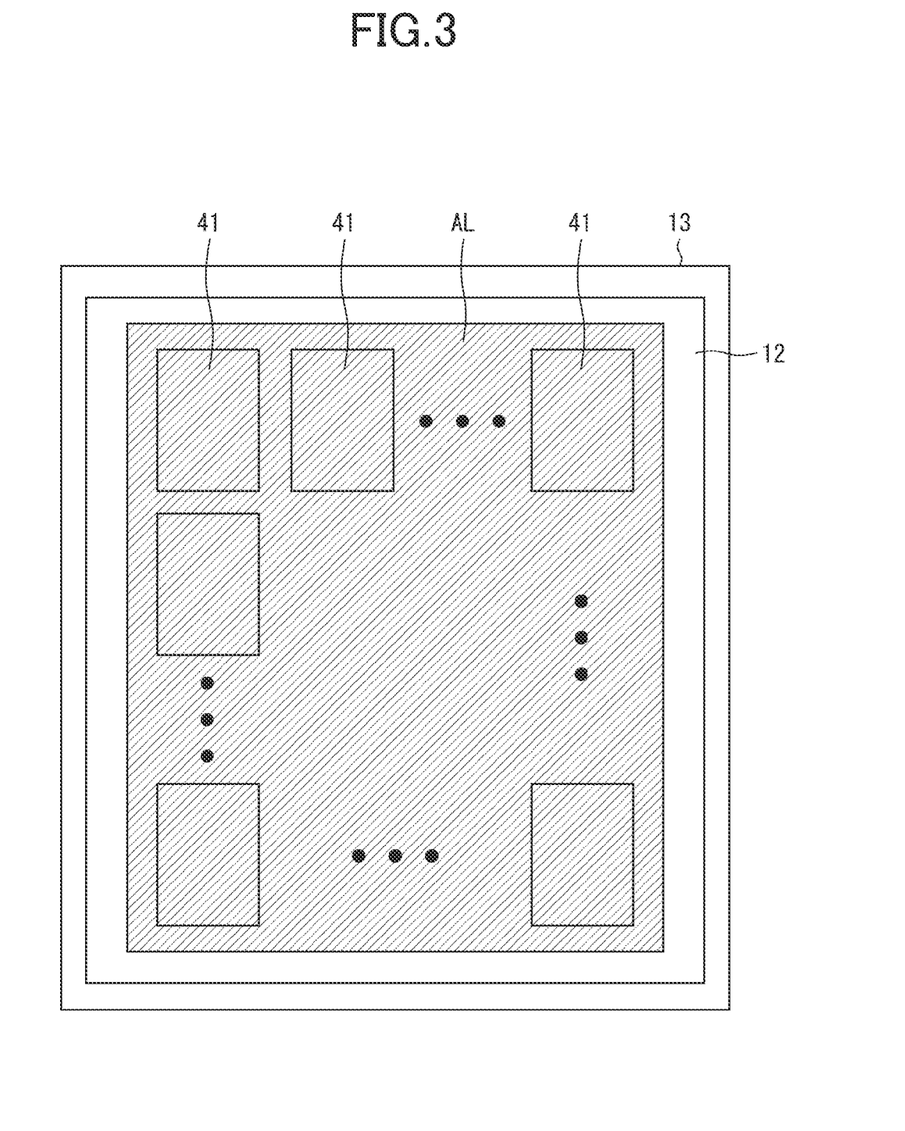
FIG. 3 illustrates, in a plan view, a method for manufacturing an electronic device according to a first embodiment.

A method for manufacturing an electronic device according to one aspect of the disclosure will be described using a manufacturing method illustrated in FIG. 3 as an example and with reference to FIGS. 1 to 3. A term "in the same layer" hereinafter refers to that one layer is formed in the same process step (film formation) as another layer. Further, a term "in a lower position than" hereinafter refers to that one layer is formed in a process step anterior to a process step of forming a comparative layer. Still further, a term "in a higher position than" hereinafter refers to that one layer is formed in a process step posterior to a process step of forming a comparative layer.

Figure 1:
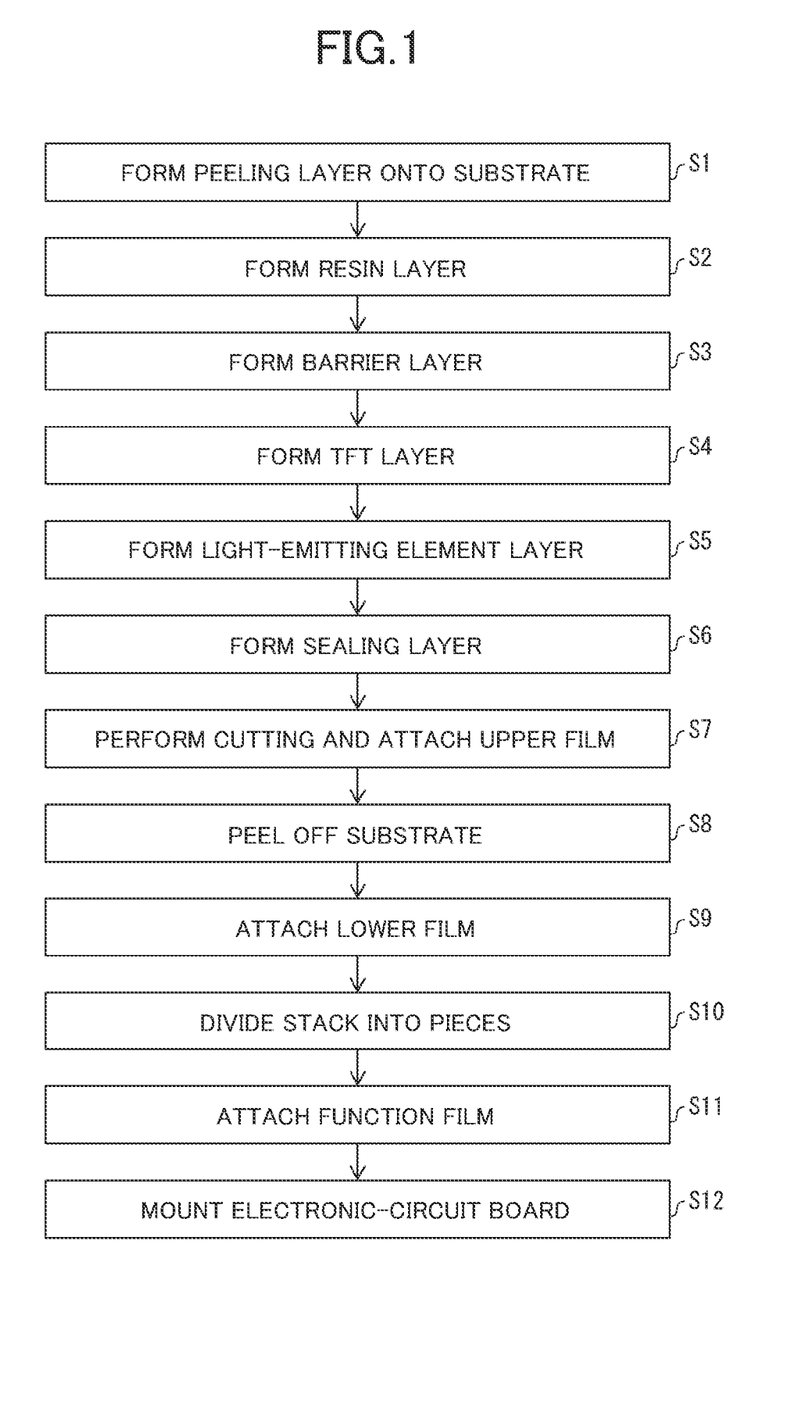
FIG. 1 is a flowchart illustrating a method for manufacturing an OLED panel.

FIG. 1 is a flowchart illustrating a method for manufacturing an electronic device according to a first embodiment. FIG. 2 is a sectional view of an example configuration of a display unit of the electronic device. FIG. 3 illustrates, in a plan view, the method for manufacturing the electronic device. The following describes how to manufacture an organic electroluminescence (EL) display device 2, which is an electronic device.

The electronic device (i.e., organic EL display device 2) according to the first embodiment has a plurality of display regions 41 disposed on a single substrate (motherboard) 13 that is transparent to light.

The method for manufacturing the electronic device according to the first embodiment includes the following sequential process steps: Step S1 (first film-formation) of forming a peeling layer AL onto the substrate 13; Step S2 (second film-formation) of forming a resin layer 12 over at least part of the peeling layer AL; Step S3 (third film-formation) of forming a barrier layer 3 all over the resin layer 12; Step S4 (fourth film-formation) of forming an electronic-circuit layer 4 in a higher position than the barrier layer 3; Step S5 of forming a top-emission light-emitting element layer (including a light-emitting layer) 5; Step S6 of forming a sealing layer 6 over the light-emitting element layer 5; and Step S7 of cutting a stack 7 and attaching an upper film 14.

The method also includes, after the foregoing, irradiating the peeling layer AL or resin layer 12 with light LV via the substrate 13. The method also includes Step S8 (peeling step) of inserting the blade of a knife or other things into the interface between the resin layer 12 and the substrate 13 or peeling layer AL to form a trigger for peeling off the substrate 13 and the peeling layer AL from the resin layer 12, and then peeling off the substrate 13 and the peeling layer AL from the resin layer 12.

The method also includes the following sequential process steps: Step S9 of attaching a lower film 10, shown in FIG. 2, onto the lower surface of the resin layer 12; Step S10 (dividing step) of dividing a stack of the lower film 10, resin layer 12, barrier layer 3, TFT layer 4, light-emitting element layer 5 and sealing layer 6 into a plurality of pieces; Step S11 of attaching a function film 39 onto the resultant pieces; and Step S12 of mounting electronic-circuit boards (e.g., IC chips) in non-display regions of the pieces to form electronic devices. It is noted that each of the foregoing process steps is performed by an electronic-device manufacturing apparatus, which will be described later on.

The substrate 13 is a glass substrate for instance. The peeling layer AL is preferably made of molybdenum forming a metal peeling layer, amorphous silicon forming a silicon peeling layer, titanium oxide forming a photocatalytic layer, or other materials. The peeling layer AL can be formed through sputtering or CVD.

Examples of the material of the resin layer 12 include polyimide and polyamide. An example of the material of the upper film 14 in Step S7 is polyethylene terephthalate (PET).

The barrier layer 3 prevents foreign substances, such as water and oxygen, from reaching the TFT layer 4 and the light-emitting element layer 5. The barrier layer 3 can be composed of a silicon oxide film, a silicon nitride film, or a silicon oxide nitride film, all of which are formed through CVD, or can be composed of a stack of these layers.

The TFT layer 4 includes the following components: a semiconductor film 15, an inorganic insulating film 16 (gate insulating film) in a higher position than the semiconductor film 15; a gate electrode GE in a higher position than the inorganic insulating film 16; an inorganic insulating film 18 in a higher than the gate electrode GE; a capacitive electrode CE in a higher position than the inorganic insulating film 18; an inorganic insulating film 20 in a higher position than the capacitive electrode CE; a source wire SH in a higher position than the inorganic insulating film 20; and a flattening film 21 in a higher position than the source wire SH. The semiconductor film 15, the inorganic insulating film 16, and the gate electrode GE constitute a thin-film transistor (TFT) Tr.

The semiconductor film 15 is composed of low-temperature polysilicon (LTPS) or an oxide semiconductor for instance. Although the transistor Tr with the semiconductor film 15 being its channel has a top-gate structure in FIG. 2, the transistor Tr may have a bottom-gate structure (e.g., the channel of the TFT is an oxide semiconductor).

The gate electrode GE, the capacitive electrode CE, and the source wire SH are composed of a metal monolayer film of at least one of, for instance, aluminum (Al), tungsten (W), molybdenum (Mo), tantalum (Ta), Chromium (Cr), titanium (Ti), and copper (Cu); alternatively, these components are composed of a laminated film of these metal materials.

The inorganic insulating films 16, 18, and 20 can be composed of a silicon oxide (SiOx) film or a silicon nitride (SiNx) film, both of which are formed through CVD, or can be composed of a laminate of these films.

The flattening film (interlayer insulating film) 21 can be made of organic material that can be applied, such as polyimide or acrylic.

The light-emitting element layer 5 (e.g., an organic light-emitting diode layer) includes an anode 22 in a higher position than the flattening film 21, an anode edge cover 23 covering the edge of the anode 22, an electroluminescence (EL) layer 24 in a higher position than the anode edge cover 23, and a cathode 25 in a higher position than the EL layer 24. Each sub-pixel has a light-emitting element (e.g., an organic light-emitting diode or OLED) including the anode 22, EL layer 24 and cathode 25, each having an island shape, and has a sub-pixel circuit that drives the element. The anode edge cover 23 (also referred to as a bank) can be made of organic material that can be applied, such as polyimide or acrylic.

The EL layer 24 is composed of the following layers sequentially stacked from below for instance: a hole injection layer, a hole transport layer, a light-emitting layer, an electron transport layer, and an electron injection layer. Whereas the light-emitting layer is formed through evaporation or an ink-jet method for each sub-pixel so as to have an island shape, one or more of the hole injection layer, hole transport layer, electron transport layer and electron injection layer can be a common flat layer or can be omitted.

The anode (positive electrode) 22 is composed of a laminate of indium tin oxide (ITO) and Ag-containing alloy for instance. The anode 22 reflects light. The cathode 25 can be composed of a conductor that is transparent to light, such as a MgAg alloy (extremely thin film) or an indium tin oxide (ITO).

When the light-emitting element layer 5 is an OLED layer, drive current between the anode 22 and the cathode 25 rejoins holes and electrons within the EL layer 24, thus generating excitons. These resultant excitons in a ground state emit light. Since the anode 22 reflects light, and the cathode 25 is transparent to light, display light DL from the EL layer 24 travels upward and goes out from the top.

The light-emitting element layer 5 may form an inorganic light-emitting diode or a quantum-dot light-emitting diode other than an OLED element.

The sealing layer 6 is transparent to light. The sealing layer 6 includes an inorganic sealing layer 26 covering the cathode 25, an organic sealing film 27 in a higher position than the inorganic sealing layer 26, and an inorganic sealing film 28 covering the organic sealing film 27. The sealing layer 6, which covers the light-emitting-element layer 5, prevents foreign substances, such as water and oxygen, from penetrating the light-emitting-element layer 5.

Each of the inorganic sealing layers 26 and 28 can be composed of a silicon oxide film, a silicon nitride film, or a silicon oxide nitride film, all of which are formed through CVD, or can be composed of a stack of these films. The organic sealing film 27 is an organic film that is thicker than the inorganic sealing films 26 and 28 and is transparent to light. The organic sealing film 27 can be made of organic material that can be applied, such as acrylic.

The lower film 10 is attached to the lower surface of the resin layer 12 after the peel-off of a support substrate, thus achieving a highly flexible display device. The lower film 10 is made of, but not limited to, PET. The function film 39 serves as, but not limited to, an optical compensator, a touch sensor, and a protector.

Step S1 (first film-formation) in FIG. 1 is forming the peeling layer AL onto the substrate 13. It is noted that the display regions 41, described later on, are formed to be stacked on the peeling layer AL.

Step S2 (second film-formation) in FIG. 1 is forming the resin layer 12 over at least part of the peeling layer AL. The resin layer 12 at least partly covering the peeling layer AL has a portion that is in contact with the peeling layer AL, and a portion that is in contact with the substrate 13 and is around the portion being in contact with the peeling layer AL.

Step S3 (third film-formation) in FIG. 1 is forming the barrier layer 3 over the upper surface and end surface of the resin layer 12. This can avoid moisture ingress into the resin layer 12, thus solving a problem, that is, (unintentional) separation of the peeling layer AL and resin layer 12 before Step S8.

Step S4 (fourth film-formation) in FIG. 1 is forming an electronic-circuit layer onto the upper surface of the barrier layer 3. The electronic-circuit layer may be a TFT layer or a touch panel layer. It is noted that when the electronic-circuit layer is a touch panel layer, the light-emitting element layer 5 and the sealing layer 6 do not have to be formed onto the upper surface of the touch panel layer.

Step S8 (peeling step) in FIG. 1 is irradiation with light LV from the lower surface of the substrate 13 to peel off, at the molecular level, the substrate 13 or the peeling layer AL from the resin layer 12. However, peeling off the substrate 13 or the peeling layer AL from the resin layer 12 is hard, because the resin layer 12 is in close contact with the substrate 13 or the peeling layer AL. Accordingly, inserting the blade of a knife or other things into the interface between the resin layer 12 and the substrate 13 or peeling layer AL forms a trigger for peel.

Referring to the peel-off of the peeling layer AL from the resin layer 12 by irradiation with light LV from the lower surface of the substrate 13, the mechanism of reduction in the binding force between the resin layer 12 and the peeling layer AL is different depending on the material of the peeling layer AL.

When the peeling layer AL is a photocatalytic layer of titanium oxide for instance, electrons and holes generated by the activation of titanium oxide (electron excitation in a valence band) separate carbon-to-carbon bonding and carbon-to-hydrogen bonding within a resin layer (e.g., a polyimide layer). The binding force between the resin layer 12 and the peeling layer AL consequently lowers. This facilitates peeling off the substrate 13 and the peeling layer AL from the resin layer 12.

When the peeling layer AL is a metal peeling layer of molybdenum for instance, the degree of thermal expansion resulting from laser light is different between the resin layer 12 and the peeling layer AL due to the difference in linear expansion coefficient between the resin layer 12 and the peeling layer AL. This facilitates peeling off the substrate 13 and the peeling layer AL from the resin layer 12.

When the peeling layer AL is a silicon peeling layer of amorphous silicon for instance, laser light causes amorphous silicon to generate hydrogen gas, thus forming a gap between the resin layer 12 and the peeling layer AL. This facilitates peeling off the substrate 13 and the peeling layer AL from the resin layer 12.

When the peeling layer AL is irradiated with light LV, the mechanism, depending on the above materials of the peeling layer, reduces the binding force between the resin layer 12 and the peeling layer AL, thus facilitating peel-off of the substrate 13 and the peeling layer AL from the resin layer 12. When the resin layer 12 is irradiated with light LV in contrast, the heat of light LV burns the resin layer 12, lowering the binding force between the substrate 13 and the resin layer 12, thus facilitating peel-off of the substrate 13 from the resin layer 12.

It is noted that at a location where the resin layer 12 and the peeling layer AL are in contact, the resin layer 12 is not directly irradiated with light LV and is thus not heated. This can prevent a carbide and trace of the resin layer 12 that are generated by light LV, at the location where the resin layer 12 and the peeling layer AL are in contact. Such a reduction in trace or carbide generated by light LV irradiation improves the visibility of the display region overlapping the peeling layer AL.

At a location where the resin layer 12 and the substrate 13 are in contact by contrast, the resin layer 12 is burned by light LV irradiation from the lower surface of the substrate 13, to generate a carbide on its lower surface. The carbide on the lower surface of the resin layer 12 facilitates inserting the blade of a knife or other things into the interface between the resin layer 12 and the substrate 13 in separating the resin layer 12 and the substrate 13. This facilitates producing a trigger for peeling off the substrate 13 from the resin layer 12.

As described above, the visibility of the display region 41 overlapping the peeling layer AL improves at the location where the resin layer 12 and the peeling layer AL are in contact. As also described above, a trigger for peeling off the substrate 13 from the resin layer 12 is produced at the location where the resin layer 12 and the substrate 13 are in contact. The peeling layer AL is hence provided in the resin layer 12, at a location where good visibility is required, such as the display region 41. Then, a location where the resin layer 12 and the peeling layer AL are not in contact is provided around the location (e.g., the display region 41) where good visibility is required, thereby achieving a trigger for peeling off the substrate 13 or the peeling layer AL from the resin layer 12. For this reason, where the resin layer 12 and the peeling layer AL are not in contact may be disposed all around or in at least part of where the resin layer 12 and the peeling layer AL are in contact.

As described above, this embodiment, which provides the peeling layer AL, can avoid a problem in the aforementioned delamination step and improve yield in the manufacture of an electronic device, unlike the foregoing conventional known example.

It is desirable that light LV be laser light. Examples of a laser-light irradiation apparatus include an excimer-laser irradiation apparatus using, for instance, XeCl gas, and a solid-laser irradiation apparatus using, for instance, yttrium aluminum garnet (YAG).

Step S9 in FIG. 1 is attaching the lower film 10 onto the resin layer 12. In the surface of the resin layer 12 onto which the lower film 10 is to be attached, there is a difference in thickness in the stack direction of the resin layer 12 between where the peeling layer AL and the substrate 13 have been peeled off and where only the substrate 13 has been peeled off. However, attaching the lower film 10 eliminates the difference in thickness in the stack direction of the resin layer 12, because the difference in the thickness of the resin layer 12 in its stack direction is smaller than the thickness of the lower film 10 in its stack direction.

Step S10 (dividing step) in FIG. 1 is cutting the stack 7 of the barrier layer 3, resin layer 12 and substrate 13 in the thickness direction of the stack 7 and through the end of the resin layer 12. Accordingly, the end surface of the barrier layer 3 and the end surface of the resin layer 12 are flush.

Modification

Figure 4:
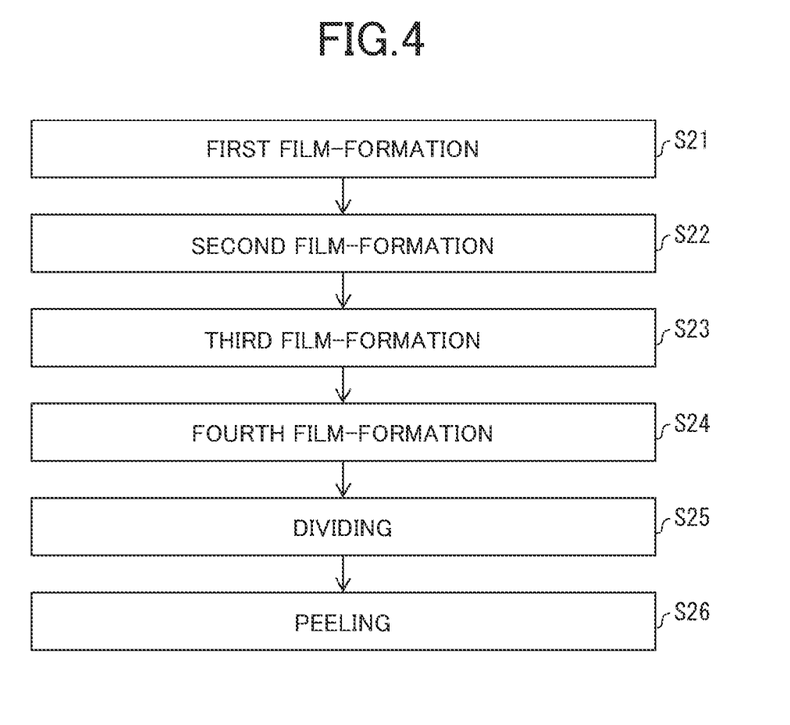
FIG. 4 is a flowchart illustrating a method for manufacturing an electronic device according to a modification of the first embodiment.
Figure 5:
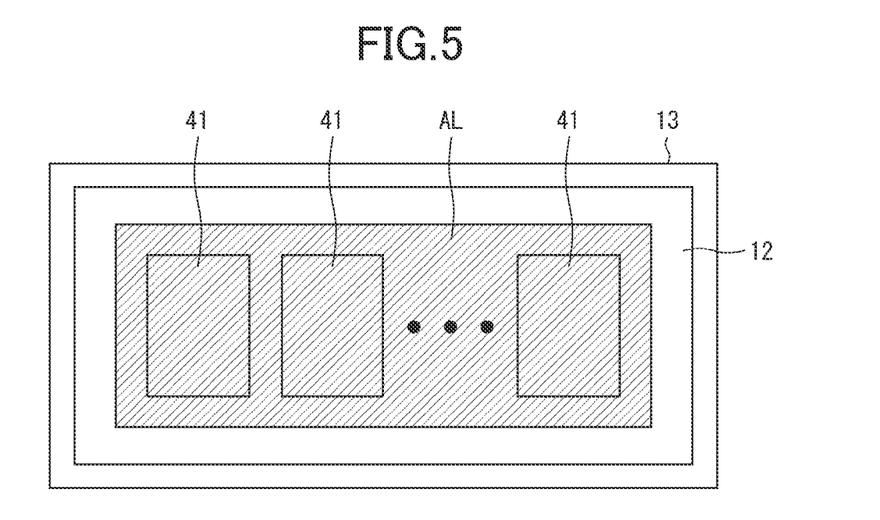
FIG. 5 illustrates, in a plan view, the method for manufacturing the electronic device according to the modification of the first embodiment.
Figure 6:
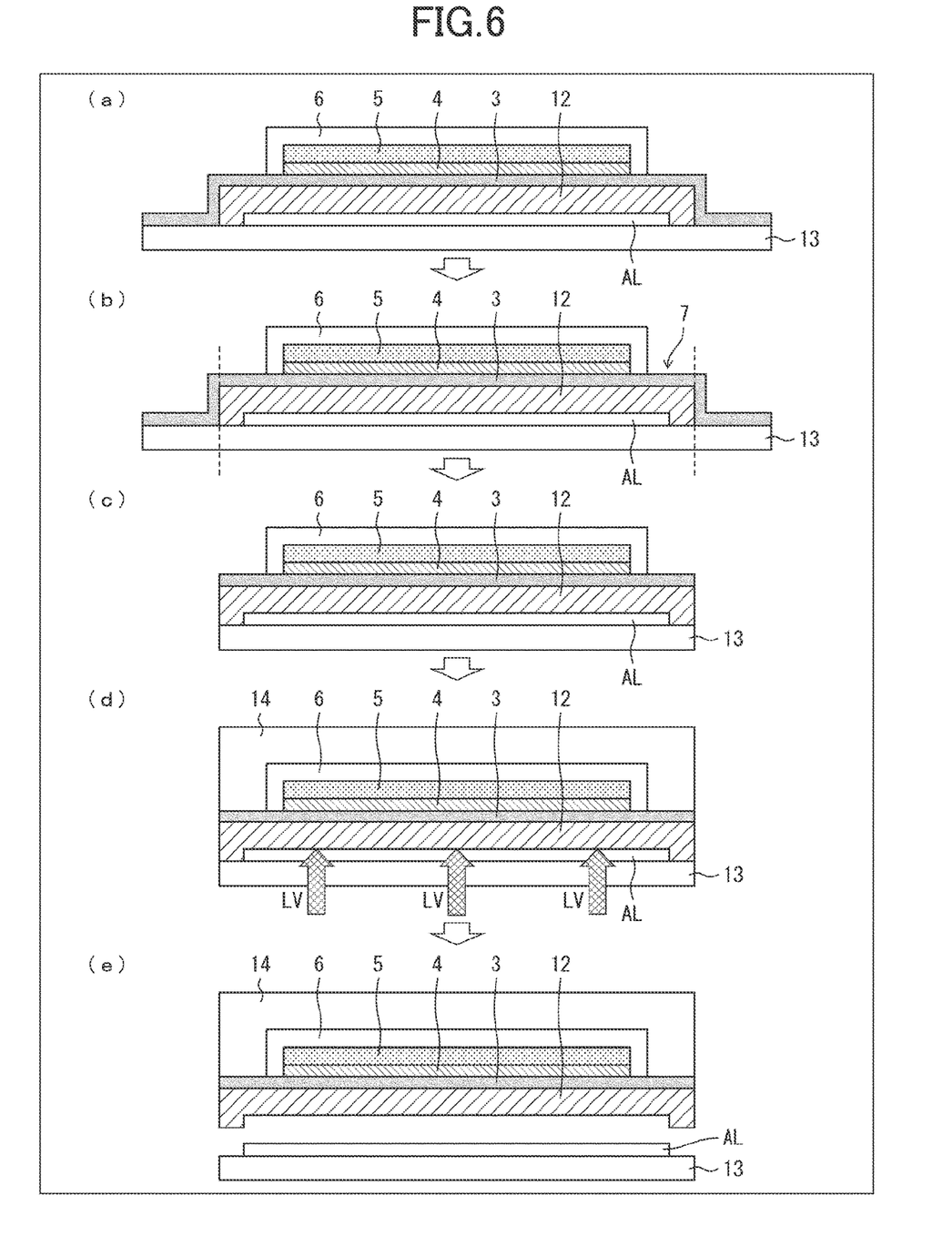
FIG. 6 illustrates, in a sectional view, the method for manufacturing the electronic device according to the modification of the first embodiment.

In a modification of the first embodiment, Step S25 may be performed that is cutting the substrate 13 into strips of desired size, as illustrated in FIGS. 4 to 6, followed by Step S26 of peeling off the substrate 13.

The substrate 13 with a blemish, a foreign substance, or other things on its backside has a region that cannot undergo laser irradiation. The region incapable of laser irradiation in the substrate 13 can have a defect, such as a break in the resin layer 12 due to forcible pulling of the resin layer 12 for peeling off the substrate 13 from the resin layer 12.

Accordingly, cutting the substrate 13 into strips enables the resin layer 12 to be exposed to air and thus contain moisture. This reduces the adhesion between the resin layer 12 and the substrate 13. As a result, even when the resin layer 12 has a stress caused by forcible pulling, the region incapable of laser irradiation in the substrate 13 can have no defect, such as a break in the resin layer 12.

Second Embodiment

Figure 7:
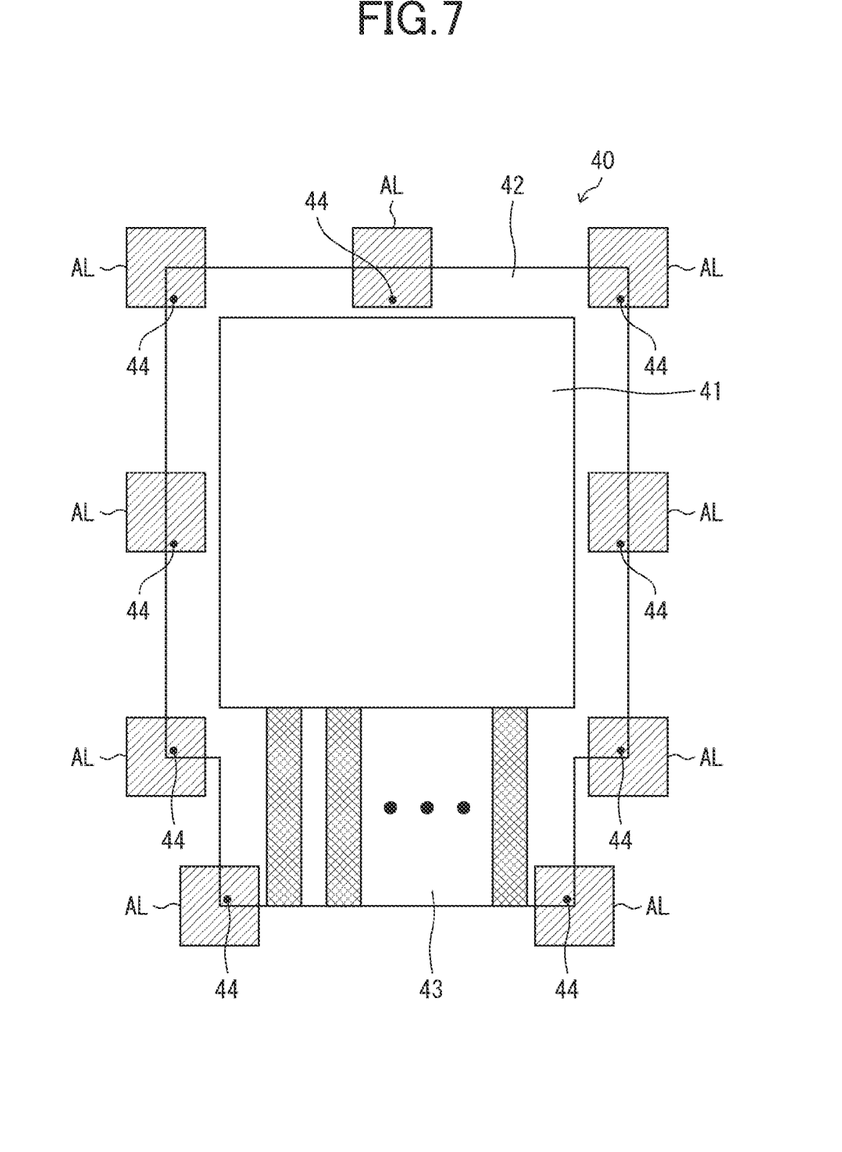
FIG. 7 illustrates, in a plan view, a method for manufacturing an electronic device according to a second embodiment.

A flexible panel 40 according to a second embodiment includes the display region 41, a frame region 42, and a terminal region 43, as illustrated in FIG. 7. In the flexible panel 40, the peeling layer AL may be disposed in locations where alignment markers 44 (e.g., cut markers) are located. FIG. 7 illustrates an instance where the peeling layer AL is not disposed in the display region 41. The peeling layer AL may be disposed in the display region 41 when, for instance, the flexible panel 40 needs to have good visibility. Providing the peeling layer AL in the locations where the alignment markers 44 are located can prevent misalignment caused by some factors, such as the alignment markers 44 with a carbide of the resin layer 12 and a laser mark thereon.

Disposed in the terminal region 43 is a terminal section (not shown) that receives an external signal and is connected to wires disposed in the electronic-circuit layer. The terminal section has a plurality of terminals connected to the wires and wires for transmitting the aforementioned electrical signal.

Modification

Figure 8:
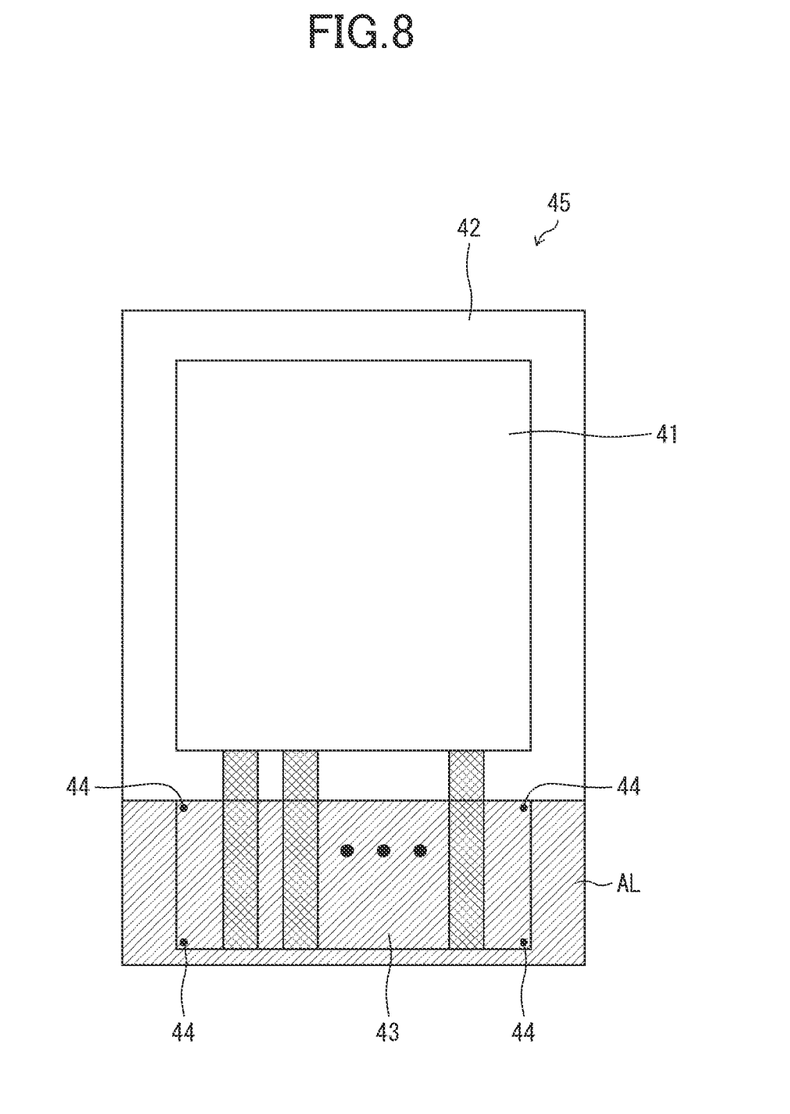
FIG. 8 illustrates, in a plan view, a method for manufacturing an electronic device according to a modification of the second embodiment.
Figure 9:
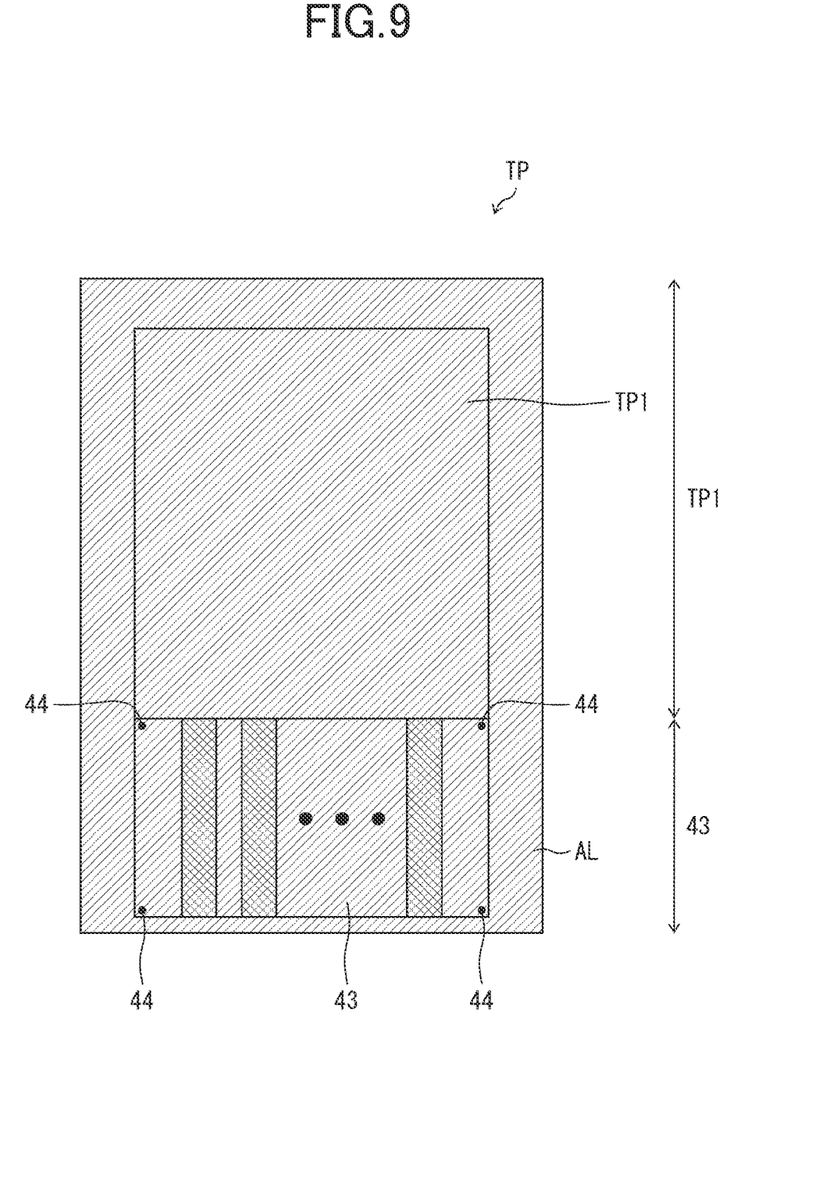
FIG. 9 is a sectional view of a configuration of a display unit of the electronic device according to the modification of the second embodiment.

In a modification of the second embodiment, the peeling layer AL may be disposed in the terminal region 43, as illustrated in FIGS. 8 and 9. The peeling layer AL in FIG. 8 is disposed in the terminal region 43, thereby preventing reduction in the readability of the alignment markers 44 caused by some factors, such as the alignment markers 44 with a carbide of the resin layer 12 and a laser mark thereon. This facilitates alignment between the markers and terminals that is to be mounted, thus preventing faulty mounting or simplifying mounting process steps. These terminals can be consequently mounted at reduced cost.

FIG. 9 illustrates a touch panel TP that includes a touch panel unit TP1 and the terminal region 43. The touch panel unit TP1 is disposed on the display surface of the organic EL display device 2, and actually serves as a touch panel (in other words, the unit receives a user operation). In the touch panel TP, the terminal region 43 provided with wires connected to respective electrodes is outside the display region; thus, the peeling layer AL does not have to be disposed in the terminal region 43.

Third Embodiment

Figure 10:
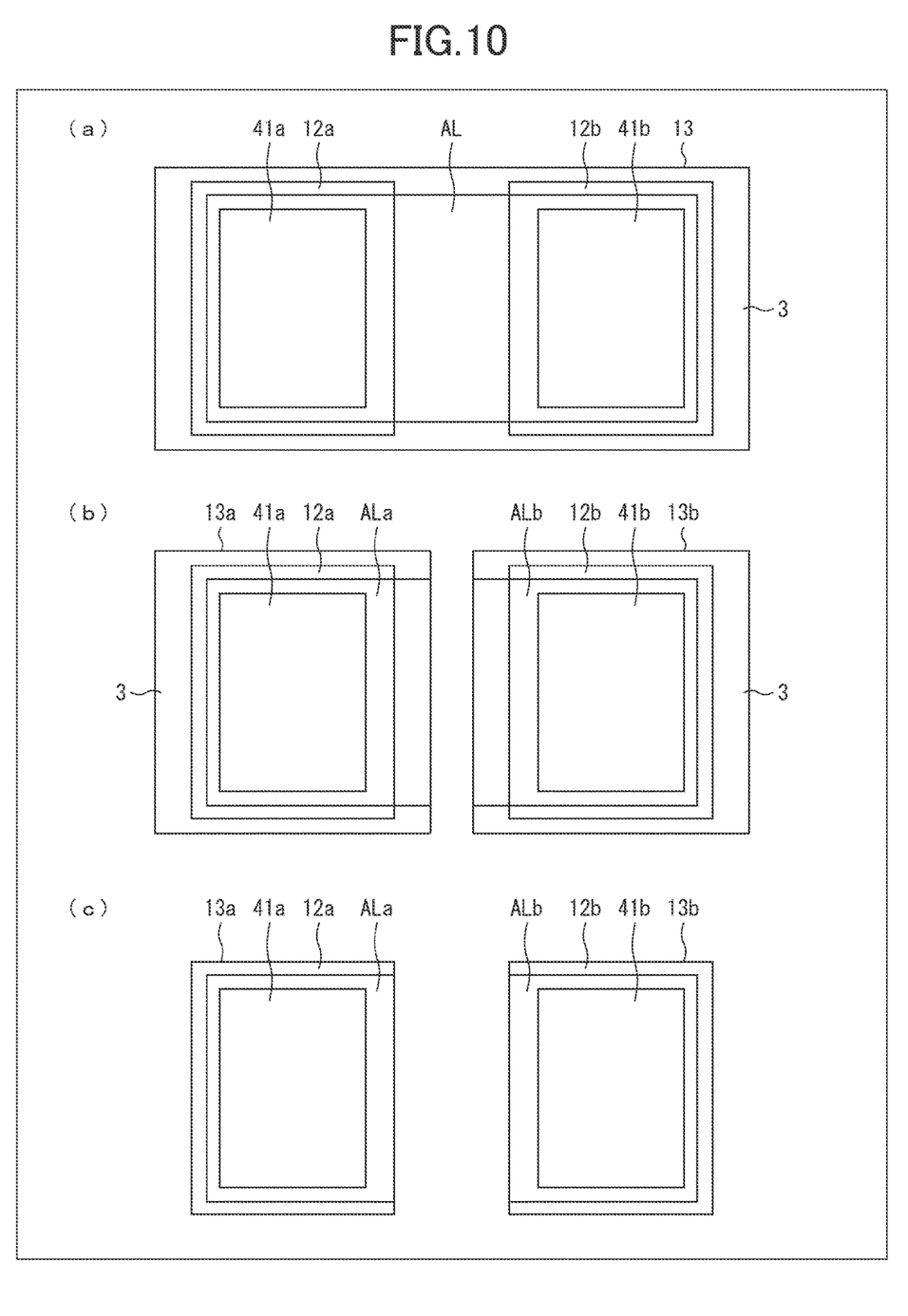
FIG. 10 illustrates, in a plan view, a method for manufacturing an electronic device according to a third embodiment.
Figure 11:
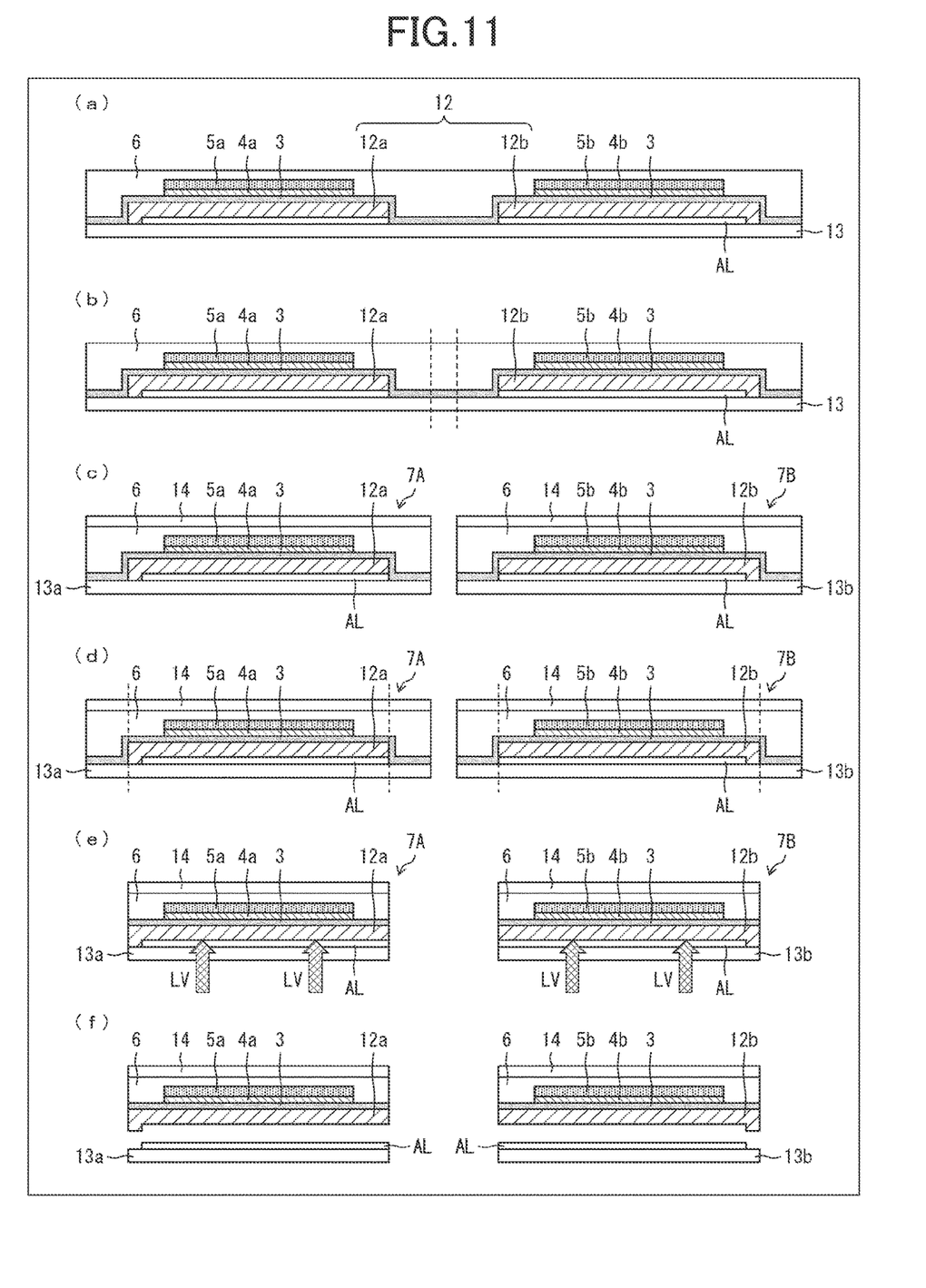
FIG. 11 illustrates, in a sectional view, the method manufacturing the electronic device according to the third embodiment.

FIG. 10 illustrates, in a plan view, a method for manufacturing a display device according to a third embodiment. FIG. 11 illustrates, in a sectional view, the method for manufacturing the display device according to the third embodiment. In FIG. 11, dividing (Step S25) is performed, followed by substrate peeling (Step 26), as shown in the flowchart of FIG. 4. In some embodiments, substrate peeling (Step S8) may be performed, followed by dividing (Step S10), as shown in FIG. 1.

As illustrated in FIGS. 10(a) and 11(a), the method according to the third embodiment includes the following sequential process steps: forming the peeling layer AL onto the large substrate 13; forming the resin layer 12 including an island-shaped first portion 12a (corresponding to a first display region 41a) and an island-shaped second portion 12b (corresponding to a second display region 41b) onto the peeling layer AL; forming the common barrier layer 3 over the first portion 12a and the second portion 12b; forming a TFT layer including a region 4a that overlaps the first portion 12a and a region 4b that overlaps the second portion 12b; forming a light-emitting element layer including a region 5a that overlaps the first portion 12a and a region 5b that overlaps the second portion 12b; and forming the sealing layer 6 over the light-emitting element layer.

The method also includes a step of pre-cut, performed after the foregoing, as illustrated in FIG. 10(b) and FIGS. 11(b) and 11(c). The pre-cut step includes the following: cutting the sealing layer 6, the barrier layer 3, the peeling layer AL, and the substrate 13 through a portion that in a plan view, is outside the first portion 12a and is where the barrier layer 3 and the peeling layer AL are in contact; and cutting the sealing layer 6, the barrier layer 3, the peeling layer AL, and the substrate 13 through a portion that in a plan view, is outside the second portion 12b and is where the barrier layer 3 and the peeling layer AL are in contact. The method also includes the following process step performed after the foregoing: attaching the upper film 14 individually onto a first stack 7A of the first portion 12a and barrier layer 3 on a divided substrate 13a, and onto a second stack 7B of the second portion 12b and barrier layer 3 on a divided substrate 13b.

The method also includes a cutting step performed after the foregoing, as illustrated in FIG. 10(c) and FIG. 11(d). The cutting step includes cutting the first stack 7A in its thickness direction and through the end of the first portion 12a, and cutting the second stack 7B in its thickness direction and through the end of the second portion 12b. The method also includes the following process step performed after the foregoing, as illustrated in FIGS. 11(e) and 11(f): applying light LV to the peeling layers AL disposed under the first stack 7A and second stack 7B to peel off the first portion 12a from the divided substrate 13a and peel off the second portion 12b from the divided substrate 13b.

In the third embodiment, the stack 7A on the divided substrate 13a (glass substrate) and the stack 7B on the divided substrate 13b (glass substrate) can be separately transported and stored. The stacks 7A and 7B are much easier to transport and store than a stack that has been peeled off from a glass substrate (i.e., a flexible stack) is.

As illustrated in FIG. 11(c), the barrier layer 3 covers the upper and end surfaces of each of the first portion 12a and second portion 12b of the resin layer. The barrier layer 3 can thus prevent foreign substances, such as water, from penetrating the resin layers 12a and 12b. This can eliminate a problem where before Step S8 (peeling step), the peeling layer AL and the first portion 12a or second portion 12b of the resin layer are (unintentionally) separated. For instance, an accident can be prevented where during the transport of the stack 7A, the first portion 12a of the resin layer is peeled off from the peeling layer AL, causing the stack 7A to fall and then break.

Although the resin layer 12 is separated into two portions in the third embodiment: the first portion 12a and the second portion 12b, the resin layer 12 may be divided into three or more portions. Further, in Steps S4 to S6, devices corresponding to a plurality of panels may be formed onto the first portion 12a, and devices corresponding to a plurality of panels may be formed onto the second portion 12b. Then, in Step S10, a plurality of electronic devices (flexible panels)

may be formed from each of the stack 7A and stack 7B. Still further, the first display region 41a and the second display region 41b may be further divided into a plurality of display regions.

The first to third embodiments have described, as a non-limiting example of an electronic device, the organic EL display device (OLED) 2 that is a top-emission display. The foregoing embodiments are applicable to a bottom-emission OLED illustrated in FIG. 12(a). In this case, the resin layer 12 is made of transparent polyimide, the anode 22 is composed of a conductor that is transparent to light, and the cathode 25 is composed of a conductor that reflects light, for instance. The foregoing embodiments have described that the lower surface of the resin layer 12 is less likely to degrade in the peeling step. Such a configuration is suitable to a display device that has a bottom-emission OLED, where display light passes through the lower surface of the resin layer 12.

Figure 12:
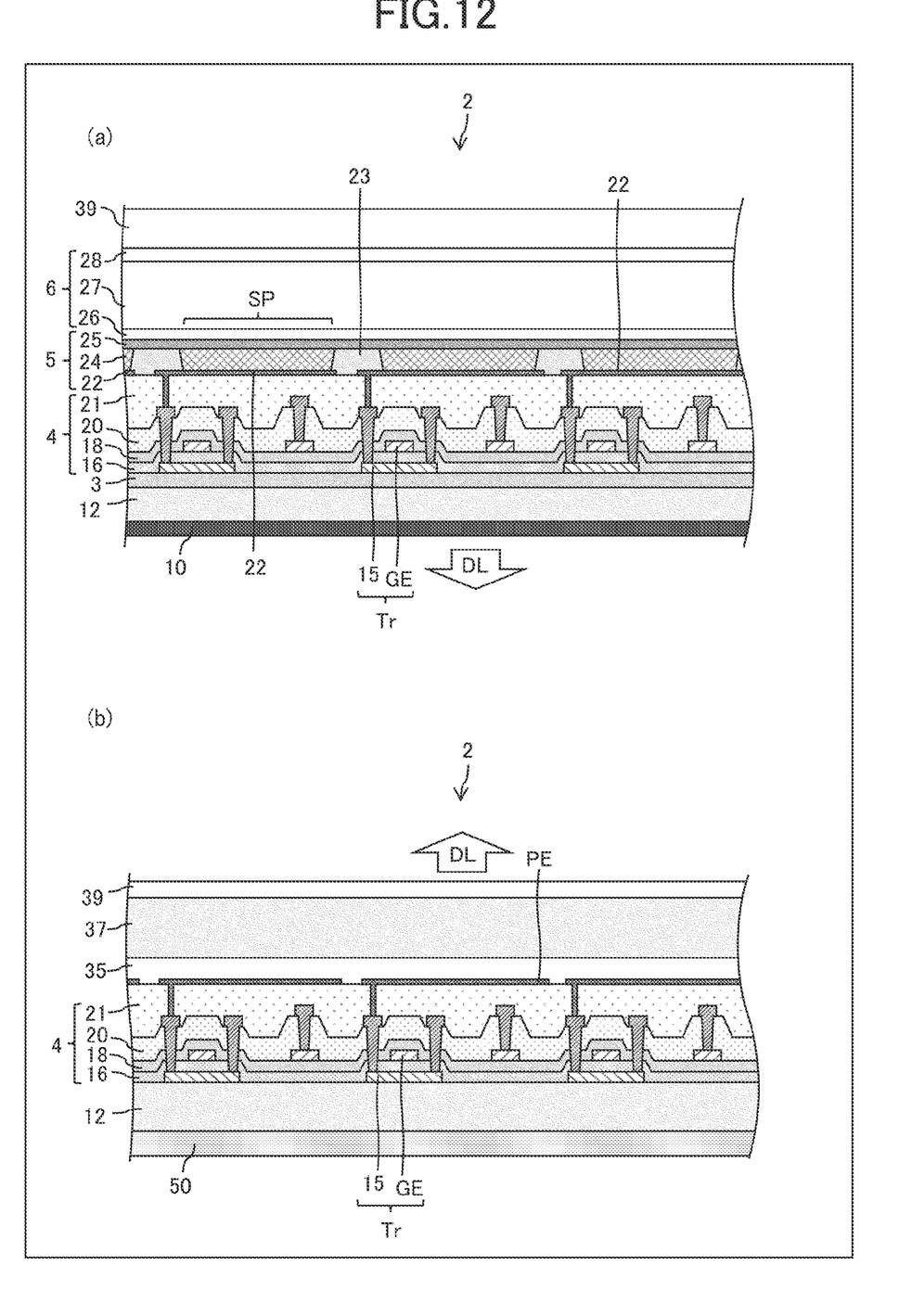
FIG. 12 is a sectional view of another configuration of the display unit of the electronic device.

The foregoing embodiments are also applicable to a flexible liquid-crystal display shown in FIG. 12(b). The liquid-crystal display in this case includes the following: a flexible backlight unit 50 disposed on the backside of the resin layer 12; the resin layer 12 composed of a transparent polyimide; a pixel electrode PE disposed in the TFT layer 4; and a liquid-crystal layer 35 disposed between the pixel electrode PE and a flexible counter substrate 37 (color filter substrate), and serving as a shutter. The foregoing embodiments have described that the lower surface of the resin layer 12 is less likely to degrade in the peeling step. Such a configuration is suitable to a liquid-crystal display where display light DL (light from a backlight) passes through the lower surface of the resin layer 12.

SUMMARY

The electronic device according to the embodiments includes any electro-optical element (any electro-optical element whose brightness and transmittance are regulated by current). Examples of the display device according to the embodiments include an organic EL display that has organic light-emitting diodes (OLEDs) as electro-optical elements, an inorganic EL display that has inorganic light-emitting diodes as electro-optical elements, and a QLED display that has quantum-dot light-emitting diodes (QLEDs) as electro-optical elements.

The disclosure is not limited to the foregoing embodiments. The technical scope of the disclosure encompasses an embodiment that is obtained in combination, as necessary, with technical means disclosed in the respective embodiments. In addition, combining the technical means disclosed in the respective embodiments can form a new technical feature.

First Aspect

A method for manufacturing an electronic device includes the following steps: first film-formation including forming a peeling layer having an island shape onto a motherboard; second film-formation including stacking a resin layer over at least a part of the peeling layer; third film-formation including forming a barrier layer over the resin layer; fourth film-formation including forming an electronic-circuit layer onto the upper surface of the barrier layer; and peeling off the resin layer from the motherboard and the peeling layer by irradiating the peeling layer and the resin layer with light.

Second Aspect

In the method according to the first aspect for instance, the second film-formation step includes stacking a resin layer all over the peeling layer.

Third Aspect

The method according to the first or second aspect, for instance, includes a step of dividing a stack of the resin layer and the harrier layer in the thickness direction of the stack and through an end of the resin layer. The dividing step is performed between the fourth film-formation step and the peeling step.

Fourth Aspect

In the method according to the third aspect for instance, the dividing step includes dividing the peeling layer and the motherboard as well as the stack.

Fifth Aspect

In the method according to the third or fourth aspect for instance, the first film-formation step includes forming the peeling layer in such a manner that the peeling layer overlaps where an alignment marker is located in the dividing step.

Sixth Aspect

In the method according to any one of the third to fifth aspects for instance, the first film-formation step includes forming the peeling layer in such a manner that the peeling layer overlaps a terminal region that receives an external signal and that is connected to a wire disposed in the electronic-circuit layer.

Seventh Aspect

In the method according to the first aspect for instance, the second film-formation step includes forming a resin layer. The resin layer includes a first portion having an island shape and a second portion having an island shape. In addition, the third film-formation step includes forming a common barrier layer over the first and second portions. In addition, the fourth film-formation step includes forming the electronic-circuit layer. The electronic-circuit layer includes a region overlapping the first portion and a region overlapping the second portion. In addition, the method includes a step of pre-cut including cutting the barrier layer, the peeling layer, and the motherboard through a portion that in a plan view, is outside the first and second portions and is where the barrier layer and the peeling layer are in contact. The pre-cut step is performed between the fourth film-formation step and the peeling step.

Eighth Aspect

The method according to the seventh aspect, for instance, includes a step of cutting a first stack of the first portion and the barrier layer in the thickness direction of the first stack and through an end of the first portion, and cutting a second stack of the second portion and the barrier layer in the thickness direction of the second stack and through an end of the second portion. The cutting step is performed between the pre-cut step and the peeling step.

Ninth Aspect

In the method according to the first to eighth aspects for instance, the peeling layer contains molybdenum.

Tenth Aspect

In the method according to the first to eighth aspects for instance, the peeling layer contains amorphous silicon.

Eleventh Aspect

In the method according to the first to eighth aspects for instance, the peeling layer contains titanium oxide.

Twelfth Aspect

In the method according to the first to eleventh aspects for instance, the electronic-circuit layer is a TFT layer.

Thirteenth Aspect

The method according to the twelfth aspect, for instance, includes forming a light-emitting element layer in a higher position than the TFT layer, which is the electronic-circuit layer.

Fourteenth Aspect

The method according to the twelfth aspect, for instance, includes forming a liquid-crystal layer in a higher position than the TFT layer, which is the electronic-circuit layer.

Fifteenth Aspect

In the method according to the first to eleventh aspects for instance, the electronic-circuit layer is a touch panel layer.

The invention claimed is:

1. A method for manufacturing an electronic device, comprising:
   first film-formation comprising forming a peeling layer having an island shape onto a motherboard;
   second film-formation comprising stacking a resin layer over at least a part of the peeling layer;
   third film-formation comprising forming a barrier layer over the resin layer;
   fourth film-formation comprising forming an electronic-circuit layer onto an upper surface of the barrier layer; and
   peeling off the resin layer from the motherboard and the peeling layer by irradiating the peeling layer and the resin layer with light, wherein
   the method further comprises dividing a stack of the resin layer and the barrier layer in a thickness direction of the stack and through an end of the resin layer, the dividing being performed between the fourth film-formation and the peeling, and
   the first film-formation includes forming the peeling layer in such a manner that the peeling layer overlaps a terminal region that receives an external signal and that is connected to a wire disposed in the electronic-circuit layer.

2. The method according to claim 1, wherein the second film-formation includes stacking a resin layer all over the peeling layer.

3. The method according to claim 1, wherein the dividing includes dividing the peeling layer and the motherboard as well as the stack.

4. The method according to claim 1, wherein the first film-formation includes forming the peeling layer in such a manner that the peeling layer overlaps where an alignment marker is located in the dividing.

5. The method according to claim 1, wherein the peeling layer contains molybdenum.

6. The method according to claim 1, wherein the peeling layer contains amorphous silicon.

7. The method according to claim 1, wherein the peeling layer contains titanium oxide.

8. The method according to claim 1, wherein the electronic-circuit layer is a TFT layer.

9. The method according to claim 8, further comprising forming a light-emitting element layer in a higher position than the TFT layer.

10. The method according to claim 8, further comprising forming a liquid-crystal layer in a higher position than the TFT layer.

11. The method according to claim 1, wherein the electronic-circuit layer is a touch panel layer.

12. A method for manufacturing an electronic device, comprising:
    first film-formation comprising forming a peeling layer having an island shape onto a motherboard;
    second film-formation comprising stacking a resin layer over at least a part of the peeling layer;
    third film-formation comprising forming a barrier layer over the resin layer;
    fourth film-formation comprising forming an electronic-circuit layer onto an upper surface of the barrier layer; and
    peeling off the resin layer from the motherboard and the peeling layer by irradiating the peeling layer and the resin layer with light, wherein
    the second film-formation includes forming a resin layer, the resin layer including a first portion having an island shape and a second portion having an island shape,
    the third film-formation includes forming a common barrier layer over the first and second portions,
    the fourth film-formation includes forming the electronic-circuit layer, the electronic-circuit layer including a region overlapping the first portion and a region overlapping the second portion, and
    the method further comprises a pre-cut comprising cutting the barrier layer, the peeling layer, and the motherboard through a portion that in a plan view, is outside the first and second portions and is where the barrier layer and the peeling layer are in contact, the pre-cut being performed between the fourth film-formation and the peeling.

13. The method according to claim 12, further comprising cutting a first stack of the first portion and the barrier layer in a thickness direction of the first stack and through an end of the first portion, and cutting a second stack of the second portion and the barrier layer in a thickness direction of the second stack and through an end of the second portion, the cutting being performed between the pre-cut and the peeling.

* * * * *